(12) United States Patent
Shimizu et al.

(10) Patent No.: US 9,872,373 B1
(45) Date of Patent: Jan. 16, 2018

(54) SMART MULTI-LEVEL RF PULSING METHODS

(71) Applicant: APPLIED MATERIALS, INC., Santa Clara, CA (US)

(72) Inventors: Daisuke Shimizu, Saratoga, CA (US); Wonseok Lee, Saratoga, CA (US); Katsumasa Kawasaki, San Jose, CA (US); Li Ling, San Jose, CA (US); Justin Phi, Milpitas, CA (US); Kevin Choi, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/415,129

(22) Filed: Jan. 25, 2017

Related U.S. Application Data

(60) Provisional application No. 62/412,798, filed on Oct. 25, 2016.

(51) Int. Cl.
    *H05H 1/46* (2006.01)
(52) U.S. Cl.
    CPC ....... *H05H 1/46* (2013.01); *H05H 2001/4645* (2013.01)
(58) Field of Classification Search
    None
    See application file for complete search history.

(56) References Cited

U.S. PATENT DOCUMENTS

| | | | |
|---|---|---|---|
| 7,967,944 B2 | 6/2011 | Shannon et al. | |
| 8,002,945 B2 | 8/2011 | Shannon et al. | |
| 8,018,164 B2 | 9/2011 | Shannon et al. | |
| 8,324,525 B2 | 12/2012 | Shannon et al. | |
| 8,357,264 B2 | 1/2013 | Shannon et al. | |
| 8,404,598 B2 | 3/2013 | Liao et al. | |
| 8,808,561 B2 | 8/2014 | Kanarik et al. | |
| 8,883,028 B2 | 11/2014 | Kanarik | |
| 8,962,488 B2 | 2/2015 | Liao et al. | |
| 8,974,684 B2 | 3/2015 | Banna et al. | |
| 9,030,101 B2 | 5/2015 | Valcore, Jr. et al. | |
| 9,171,699 B2 | 10/2015 | Valcore, Jr. et al. | |
| 9,197,196 B2 | 11/2015 | Valcore, Jr. et al. | |
| 9,214,320 B2 | 12/2015 | Kanarik | |
| 9,318,304 B2 | 4/2016 | Leray et al. | |

(Continued)

*Primary Examiner* — Jany Richardson
(74) *Attorney, Agent, or Firm* — Moser Taboada; Alan Taboado

(57) ABSTRACT

Methods of operating a plasma enhanced substrate processing system using multi-level pulsed RF power are provided herein. In some embodiments, a method of operating a plasma enhanced substrate processing system using multi-level pulsed RF power includes providing a first multi-level RF power waveform to a process chamber, the first multi-level RF power waveform having at least a first power level, a second power level, and a third power level, providing, after a first delay period, a second multi-level RF power waveform to the process chamber, the second multi-level RF power waveform having at least a first power level, a second power level, and a third power level, and processing the substrate using the first multi-level RF power waveform and the second multi-level RF power waveform to produce a features on the substrate have an aspect ratio of greater than 60:1 while maintaining an etch rate of greater than 170 nm/min.

20 Claims, 10 Drawing Sheets

(56) References Cited

U.S. PATENT DOCUMENTS

| | | |
|---|---|---|
| 9,536,749 B2 | 1/2017 | Marakhtanov et al. |
| 9,614,524 B1 | 4/2017 | Kawasaki |
| 2014/0009073 A1 | 1/2014 | Valcore, Jr. et al. |
| 2014/0265852 A1 | 9/2014 | Valcore, Jr. et al. |
| 2014/0342570 A1* | 11/2014 | Doan ................. H01L 21/3065 438/714 |
| 2015/0020971 A1 | 1/2015 | Kanarik |
| 2015/0048740 A1 | 2/2015 | Valcore, Jr. et al. |
| 2015/0214012 A1 | 7/2015 | Valcore, Jr. et al. |
| 2017/0098527 A1 | 4/2017 | Kawasaki et al. |
| 2017/0099722 A1* | 4/2017 | Kawasaki ................. H05H 1/46 |
| 2017/0103873 A1 | 4/2017 | Kawasaki |
| 2017/0229312 A1* | 8/2017 | Park ................. H01J 37/32082 |

\* cited by examiner

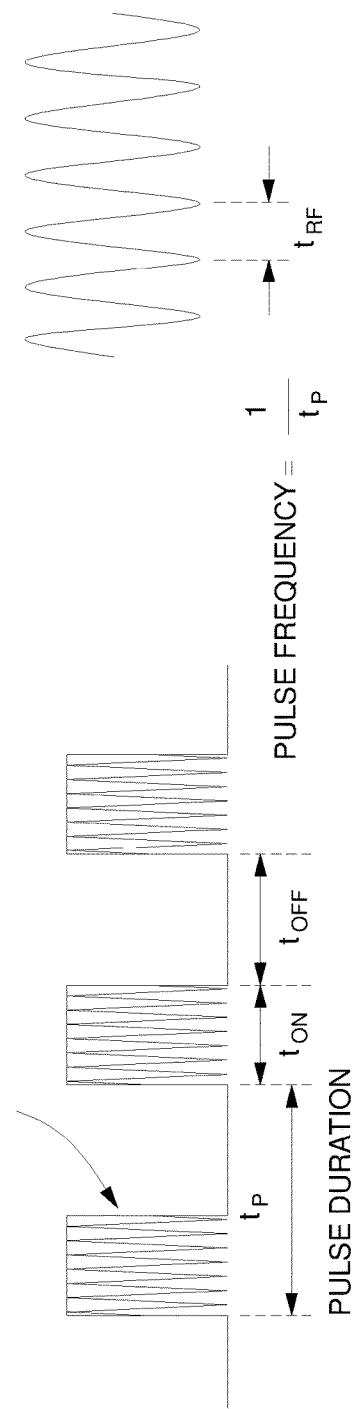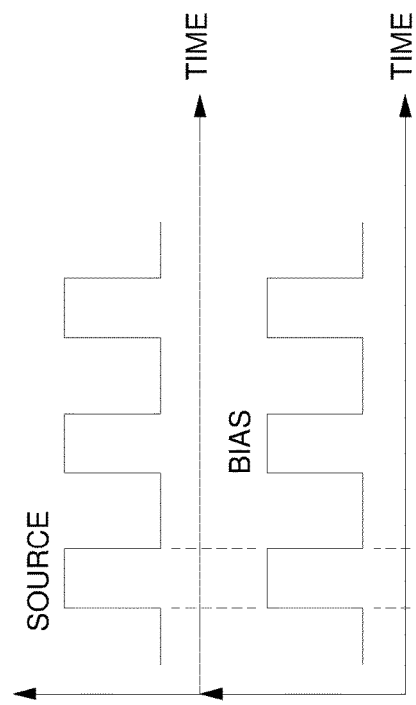
FIG. 2A
FIG. 2B
FIG. 2C

SMART MULTI-LEVEL RF PULSING METHODS

CROSS-REFERENCE TO RELATED APPLICATIONS

This application claims benefit of U.S. provisional patent application Ser. No. 62/412,798, filed Oct. 25, 2016, which is herein incorporated by reference in its entirety.

FIELD

Embodiments of the present disclosure generally relate to RF power delivery methods used for processing a substrate. More specifically, some embodiments consistent with the present disclosure relate to smart multi-level RF pulsing that can be used for three dimensional (3D) NAND Memory Hole Reactive Ion Etching (RIE) processes and the like.

BACKGROUND

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing 3D stacking of semiconductor chips, specific structures (e.g., stair-like structures) are often utilized to allow multiple interconnection structures to be disposed thereon, forming high-density of vertical transistor devices.

When forming features, such as trenches or vias, in stair-like structures in a film stack disposed on a substrate, an etch process using a photoresist layer as an etching mask is often utilized. The film stack comprises multiple material layers in which the features, such as trenches or vias, are formed with high aspect ratios. Aspect ratios (A/R) are generally defined as the ratio between the depth of the feature and the width of the feature. In the past, a 20:1 A/R was considered a high A/R. However, next generation devices and structures attempt A/Rs of 50:1, 60:1 and higher (e.g., 70:1 or more).

However, the inventors have identified some key challenges for performing 3D NAND Memory Hole RIE processes with greater than 40:1 aspect ratios. For example, the etching mask material entrance is easily clogged when performing the RIE processes longer in an attempt to achieve higher aspect ratios (i.e., when trying to create deeper holes/vias). Some other issues experienced include ARDE (Aspect Ratio Dependent Etching) symptoms and Profile Bowing. Specifically, as the etching gets deeper, the etching rate gets slower. As etching rate slows, the productivity of the tool to produce devices is reduced. Etch rates as low as 130 nm/min have been overserved under existing process techniques are higher A/Rs. Furthermore, irregular profiles and growth of the etching by-products may be formed during etching may gradually block the small openings used to fabricate the small critical dimension structures, thereby resulting in bowed, distorted, toppled, or twisted profiles of the etched structures. Redeposition material or build-up of etching by-products may be randomly and/or irregularly adhere to the top surface and/or sidewalls of the film stack, the resulting irregular profile and growth of the redeposition material or etching by-products may alter the flow path of the reactive etchants, resulting in a bowing or twisting profile of the features formed in the film stack.

Thus, there is a need for improved methods for forming high aspect ratio features with accurate profiles and dimension control for three dimensional (3D) stacking of semiconductor chips.

SUMMARY

Methods of operating a plasma enhanced substrate processing system using multi-level pulsed RF power are provided herein. In some embodiments, a method of operating a plasma enhanced substrate processing system using multi-level pulsed RF power includes providing a first multi-level RF power waveform to a process chamber, the first multi-level RF power waveform having at least a first power level, a second power level, and a third power level, providing, after a first delay period, a second multi-level RF power waveform to the process chamber, the second multi-level RF power waveform having at least a first power level, a second power level, and a third power level, and processing the substrate using the first multi-level RF power waveform and the second multi-level RF power waveform to produce a features on the substrate have an aspect ratio of greater than 60:1 while maintaining an etch rate of greater than 170 nm/min.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 2A-C depicts pulsed waveforms of radio frequency signals in accordance with some embodiments of the present disclosure.

Figure 1:
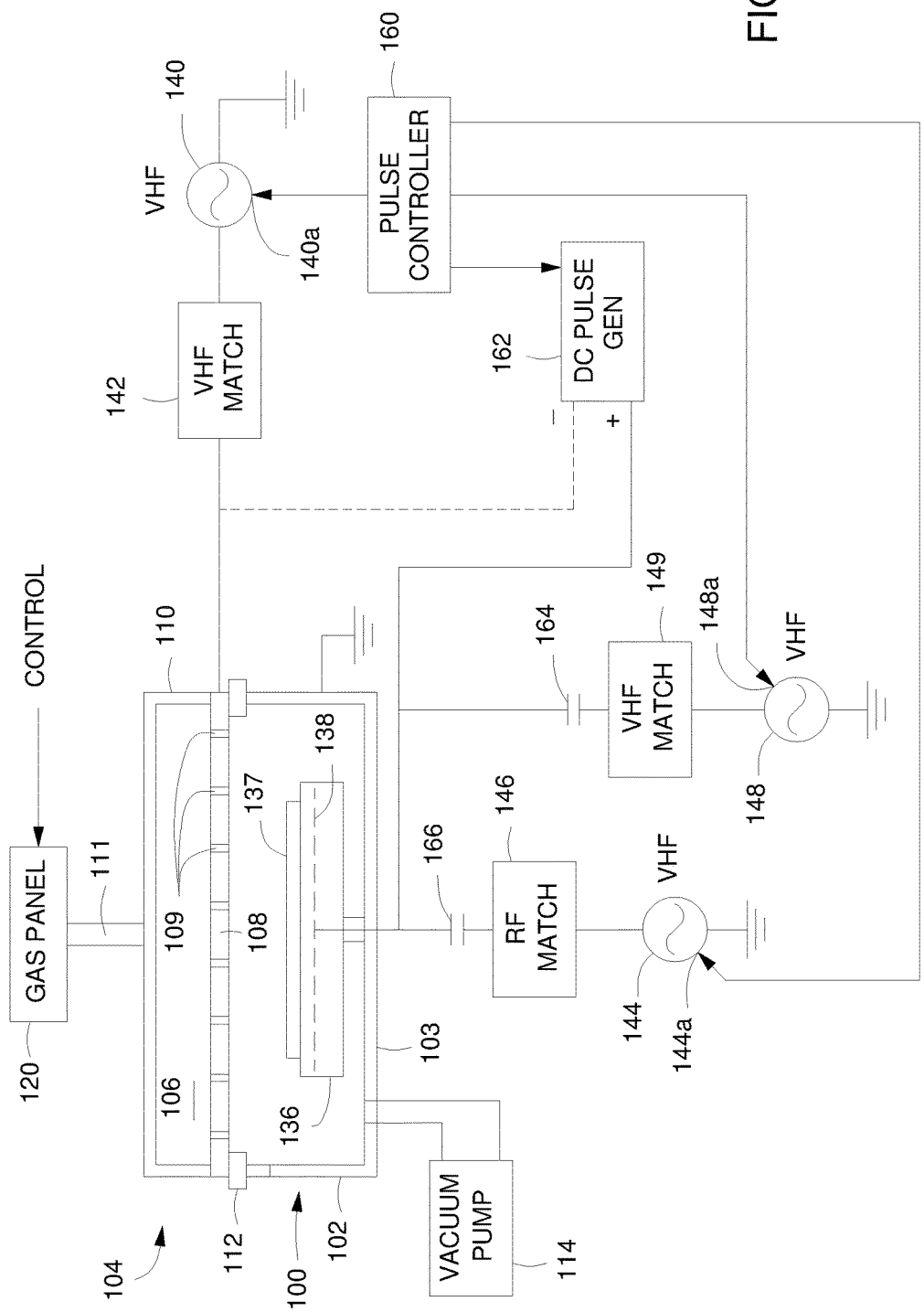
FIG. 1 depicts a plasma reactor in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide methods for operating a plasma enhanced substrate processing system using multiple level pulsed radio frequency (RF) power for three dimensional (3D) NAND Memory Hole Reactive Ion Etching (RIE) processing. In addition, embodiments of the present disclosure provide methods for forming features in a film stack which may be utilized to form high A/R features on a substrate for three dimensional (3D) stacking of semiconductor chips.

In some embodiments, precise dimension control, accurate feature transfer and good process control during etching may be obtained through multi-level RF pulsing (as opposed to using a continuous wave process). Multi-level RF pulsing includes a Dual Level Pulsing (DLP) and/or Triple Level Pulse (TLP) which is defined by the sequence of (1) high setpoint, (2) low setpoint and/or (3) turn-off period, as will be described below in further detail. Specifically, the inventors have found that the polymerizing chemistry used in existing processing may cause clogging of the hole openings. If no polymerizing chemistry is used, there is no way to control the profile bowing. Thus, the inventors found that the amount of polymerizing chemistry must be controlled to produce acceptable levels of A/R and profile bowing. However, the process window is very small to balance the polymerizing chemistry to achieve the desired parameters.

Instead, the inventors have found that the use of the inventive multi-level pulsing techniques described herein advantageously provides improved mask selectivity (e.g., >5:1), and maintains a wider process window which protects against etch stop issues that arise due to the mask entrance being clogged. Furthermore, embodiments consistent with the present disclosure reduce profile bowing effects (e.g., delta CD<20 nm) and an aspect ratio (A/R) of greater than 60:1 while maintaining an etch rate of greater than 170 nm/min. In some embodiments, the A/R is greater than 60:1 and the etch rate is maintained at least a level of 240 nm/min. In some embodiments, the A/R is greater than 70:1 and the etch rate is maintained at a level of 250-350 nm/min.

Other advantages observed include the availability of a large variety of pulsing modes (single, dual, triple, and higher pulsing modes) by precisely synchronizing all RF components with fast TTL communication and using fully automatic tuning, and the ability to provide a highly scalable RF pulse architecture.

FIG. 1 depicts a plasma reactor which may be utilized to perform the inventive methods disclosed herein. The inventive methods may be performed in a capacitively coupled plasma reactor (e.g., as illustrated in FIG. 1) or any other suitable plasma reactor, such as an inductive coupled plasma reactor. However, the inventors have observed that the inventive methods can be particularly beneficial in capacitively coupled plasma reactors, such as where high bias power (e.g., about 2000 W or more) and low source power (e.g., about 500 W or less) is used, as undesired charging effects can be much more severe than, for example, in inductively coupled plasma processing chambers. In some embodiments, the inventors have discovered that the present inventive methods provide particular benefit in configurations where at least one of a DC bias ($V_{DC}$), a $V_{RF}$, or a plasma sheath voltage are at or above about 1000V.

The reactor of FIG. 1 includes a reactor chamber 100 enclosed by a cylindrical side wall 102, a floor 103 and a ceiling 104. The reactor chamber 100 is capable of performing Reactive Ion Etching (RIE) processing. RIE uses chemically reactive plasma to remove material deposited on substrates. The plasma is generated under low pressure (vacuum) by an electromagnetic field. High-energy ions from the plasma attack the substrates surface and react with it to form the desired structures on the substrate (i.e., holes, vias, trenches, etc.).

The ceiling 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., ceiling 104) is electrically insulated from the cylindrical side wall 102 by an insulating ring 112. A vacuum pump 114, such a turbomolecular pump, evacuates the chamber 100. A gas panel 120 controls the individual flow rates of different process gases to the gas supply inlet 111. A workpiece support pedestal 136 supported through the floor 103 of the chamber may have an insulating top surface and an internal electrode (substrate support electrode 138). The internal electrode may, for example, be used for chucking a substrate 137 on the top surface of the support pedestal 136. Plasma source power is applied to the ceiling 104 (also referred to herein as a gas distribution showerhead) from a generator 140 through an impedance matching network 142. The ceiling or gas distribution showerhead is formed of a conductive material, such as aluminum for example, and therefore serves as a ceiling electrode. The generator 140 may generate VHF power in the high portion of the VHF spectrum, such as in a range of 100 to 200 MHz. The generator 140 has the capability of pulsing the VHF power generated at a desired pulse rate and duty cycle. For this purpose, the VHF source generator 140 has a pulse control input 140a for receiving a control signal or signals defining the pulse rate and/or duty cycle as well as the phase of each pulse produced by the RF generator 140.

Plasma bias power is applied to the substrate support electrode 138 from an RF bias generator 144 through an RF impedance matching network 146, and RF bias generator 148 through an RF impedance matching network 149. The RF bias generators 144, 148 may generate HF or LF power in the low portion of the HF spectrum or in the LF to MF spectrum, such as in a range of 400 KHz to 60 MHz. The RF bias generators 144, 148 have the capability of pulsing the RF bias power generated at a desired pulse rate and duty cycle. For this purpose, the RF bias generators 144, 148 have pulse control inputs 144a, 148a for receiving a control signal or signals defining the pulse rate and/or duty cycle as well as the phase of each pulse produced by the RF generators 144, 148. The RF bias generators 144, 148 may be independently pulsed, phased, and/or duty cycle controlled. Further, the RF bias generators 144, 148 may be pulsed synchronously or asynchronously.

Optionally, plasma source power may be applied to the substrate support electrode 138 from a second VHF generator through a VHF impedance match (not shown). The second VHF generator may generate VHF power in the low portion of the VHF spectrum, such as in a range of 50 to 100 MHz. The second VHF generator has the capability of pulsing the VHF power generated at a desired pulse rate and duty cycle. For this purpose, the second VHF generator has a pulse control input for receiving a control signal or signals defining the pulse rate and/or duty cycle as well as the phase of each pulse produced by the second VHF generator. For example, in some embodiments, one of the RF bias generators 144, 148 and its components (e.g., match, pulse control inputs, etc.) can be replaced with the second VHF generator and its components. Alternatively, the second VHF generator and its components may be included in addition to the first RF generator 140, and the bias generators 144, 148 and their respective components.

In some embodiments, the matching networks 142, 146, and 149 may be formed by one or more capacitors and/or an inductor. The values of capacitor may be electronically or mechanically tuned to adjust the matching of each of the matching networks 142, 146, and 149. In lower power systems, the one or more capacitors may be electronically tuned rather than mechanically tuned. In some embodiments, the matching networks 142, 146, and 149 may have a tunable inductor. In some embodiments, one or more of the capacitors used in the matching networks 142, 146, and 149 may be one or more fixed capacitors or series capacitors. In other embodiments, one or more of the capacitors used in the matching networks 142, 146, and 149 may be a variable capacitor, which may be electronically or mechanically tuned to adjust the matching of the matching networks 142, 146, and 149. In some embodiments, one or more of the matching networks 142, 146, and 149 may have a capacitive shunt to ground. The above described matching networks are illustrative only and other various configurations of matching networks having one or more adjustable elements for tuning the matching network may be utilized and tuned in accordance with the teachings provided herein.

A pulse controller 160 is programmable to apply pulse control signals to each of the pulse control inputs 140a, 144a, 148a of the generators 140, 144, 148, to produce the desired phase lead or lag relationship and/or duty cycle relationship among the pulses of the generator 140 (e.g., VHF source power generator) and the RF bias power generators 144, 148. Although shown as a separate component in FIG. 1, in some embodiments, the pulse controller 160 can be disposed internally inside of each RF generator. Synchronization signals (e.g., TTL signals) would be generated at a master generator (e.g., generator 140), and sent to other slave generators (e.g., generators 144 and/or 148) either directly to each other or through pulse controller 160. Although generator 140 is described in the example above as the master generator, any one of the generators (140, 144, 148, or 162) can be designated as a master generator and the others as slave generators.

In some embodiments, the RF generators 140, 144 and 148, the match networks 142, 146, and 149, and/or the pulse controller 160 comprise a central processing unit (CPU), a plurality of support circuits, and a memory. While the present exemplary embodiments of the RF generators 140, 144 and 148, the match networks 142, 146, and 149 and pulse controller 160 are discussed with respect to a computer having a CPU, support circuits, and a memory, one of ordinary skill in the art would recognize that RF generators 140, 144 and 148, the match networks 142, 146, and 149, and pulse controller 160 could be implemented in a variety of ways, including as an application specific interface circuit (ASIC), a field-programmable gate array (FPGA), a system-on-a-chip (SOC), and the like. Various embodiments of the pulse controller 160 may also be integrated within other process tool controllers, with corresponding input/output interfaces as known in the art.

The support circuits may include a display device as well as other circuits to support the functionality of the CPU. Such circuits may include clock circuits, cache, power supplies, network cards, video circuits and the like The memory may comprise read only memory, random access memory, removable memory, disk drives, optical drives and/or other forms of digital storage. The memory is configured to store an operating system, and a sub-fab control module. The operating system executes to control the general operation of the RF generators 140, 144 and 148, the match networks 142, 146, and 149, and pulse controller 160, including facilitating the execution of various processes, applications, and modules to control the one or more generators 140, 144 and 148 or the match networks 142, 146, and 149 in order to perform the methods discussed here (e.g., method 600 discussed below).

Further, a DC generator 162 may be coupled to either (or both) the substrate support electrode 138 and the ceiling 104. In some embodiments, DC generator 162 may supply continuous and/or variable DC. In some embodiments, DC generator 162 may provide pulsed DC power. The pulse repetition rate, phase and duty cycle of the DC generator are controlled by the pulsed controller 160. A DC isolation capacitor 164, 166 may be provided to isolate each RF generator from the DC generator 162. A DC signal generated by the DC generator may be synchronized with the RF signals generated by the generators 140, 144, and 148 to provide benefits such as reduced charge-up on a substrate 137 or improved etch rate control of the substrate using a plasma formed in the plasma reactor.

FIG. 2A depicts a time domain waveform diagram that may reflect the pulsed RF output of each of the generators 140, 144, 148, showing the pulse envelope of the pulsed RF output, characterized by the following parameters controlled by the pulse controller 160 individually for each generator 140, 144, 148: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

FIGS. 2B and 2C depict contemporaneous time domain waveforms of two RF pulsed signals synchronized together in such a manner that they have identical phase and duty cycle and therefore a phase difference of zero between them. The exemplary embodiment depicted in FIGS. 2B and 2C is one exemplary form of synchronization between a first pulsed RF signal (e.g., a pulsed source signal) and a second pulsed RF signal (e.g., a pulsed bias signal). In this exemplary embodiment, both the phase and duty cycle of each pulsed signal is the same.

Figure 3B:
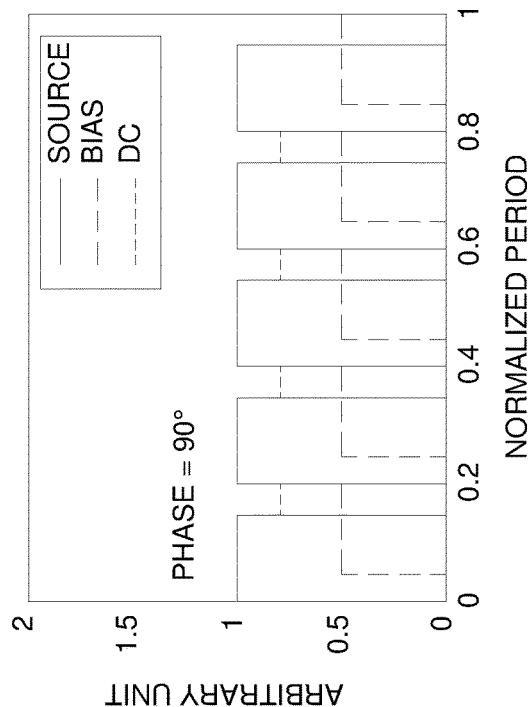
FIG. 3A-D depicts phase variance between pulsed waveforms in accordance with some embodiments of the present disclosure.
Figure 3A:
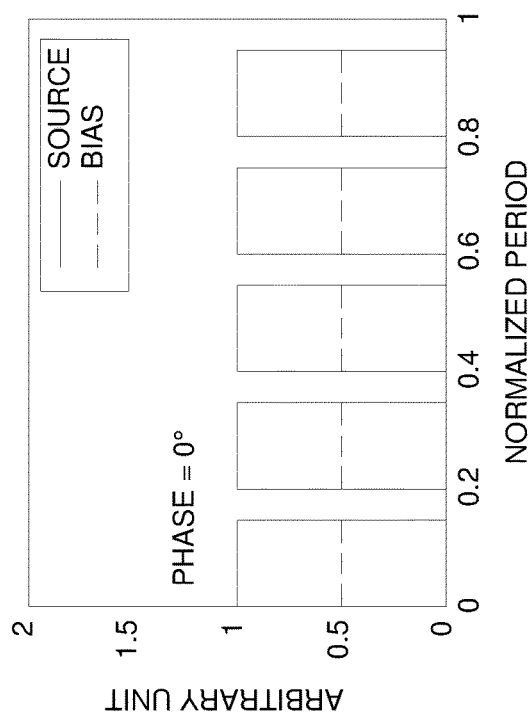
Figure 3C:
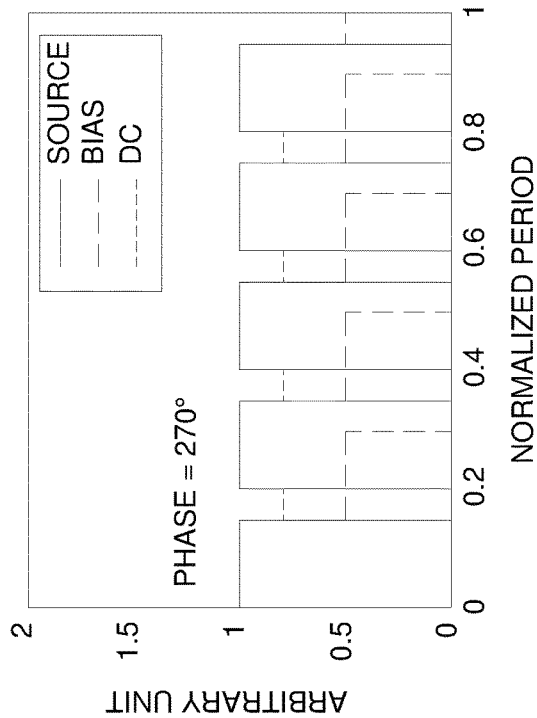
Figure 3D:
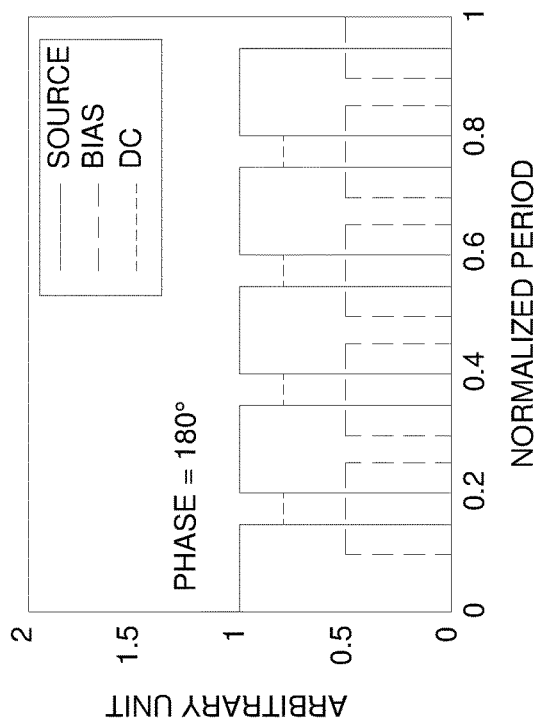

In some embodiments of the present disclosure, the pulsed signals provided by the generators 140, 144, and 148 are varied in phase. FIGS. 3A through 3D illustrate how the phase difference may be varied by the pulse controller 160, and depict the superposition of the source and bias power waveforms at phase differences of 0°, 90°, 180° and 270°, respectively, where the phase difference is defined by how much the second pulse output lags the first pulse output. FIG. 3A corresponds to the example of zero phase difference of FIG. 2B. FIG. 3B depicts a case in which the bias power pulse output lags the source power pulse output by 90°. FIG. 3C depicts a case in which the bias power pulse output lags the source power pulse output by 180 degrees. FIG. 3D depicts a case in which the bias power pulse output lags the source power pulse output by 270°. Although FIGS. 3A-3B only depict two pulsed RF signals with varying phase, in embodiments consistent with the present disclosure can also include three or more pulsed RF signals with varying phases.

FIGS. 3A through 3D depict a duty cycle of 75% for all pulse outputs. However, the duty cycle may be less, for example about 40% for all pulse outputs. In some embodiments, the duty cycles for RF signals generated by each of the generators 140, 144, 148 are the same. Alternatively, in some embodiments, one or more of the duty cycles may be different. For example, the RF signals from the generators 140, 144 may be synchronized together with a phase lag between with a duty cycle of 45% while the RF bias power generator 148 may have a duty cycle of 35%. However, the RF signal generated by the generator 148 may be synchronous with respect to the synchronous RF signals generated by the generators 140, 144 provide that it has the same pulse duration as the other two RF signals.

In some embodiments, during each "off" time of the VHF source power pulse output, a negative D.C. pulse may be applied to the substrate support electrode 138 and/or a positive D.C. pulse may be applied to the ceiling 104, from the D.C. pulse generator 162. This is depicted in the dotted line waveforms of FIGS. 3B, 3C and 3D. This feature may boost positive ion flux to the workpiece during the source power "off" time when positive ions are plentiful, to equalize the average flux of positive and negative ions over each complete cycle. This equalization may be optimized by controlling the voltage of the D.C. pulse generator 162.

In some embodiments, etching rates may be enhanced while pulsing the plasma by controlling the phase lead or lag of the RF envelopes. When the source and bias are pulsed independently out-of-phase, or with varying duty cycle, the different plasma dynamics of the very high frequency (VHF) and low frequency (LF) allow for better plasma fill over the entire pulse. In some embodiments, a combination of VHF of about 162 MHz source frequency is used in conjunction with a bias frequency of about 13.56 MHz and another bias frequency of about 2 MHz. In some embodiments, a combination of VHF of about 162 MHz source frequency is used in conjunction with a bias frequency of about 60 MHz and another bias frequency of about 2 MHz. In some embodiments, a combination of VHF of about 120 MHz source frequency is used in conjunction with a bias frequency of about 2 MHz and another bias frequency of about 400 kHz.

A pulse repetition frequency may range from about 0.1 kHz to about 20 kHz, which is synchronized between all generators (e.g., all generators share the same pulse repetition frequency or an integral multiple thereof). The pulse duty cycle (time for which power is supplied) may independently vary from about 10% to about 90% for each generator. In addition, the phase lag between each generator may be controlled. By controlling the overlap between the RF envelopes of the pulses, the plasma ion density non-uniformity can be minimized. For example, a low frequency (LF) signal may produce a predominantly higher edge plasma ion density, and a very high frequency (VHF) signal may produce a predominantly higher central region plasma ion density. Pulsing the source and bias with moderate phase lag can thus be used to achieve enhanced etch rates despite the lower time averaged power deposition as compared to continuous mode. The higher etch rates are favored owing to a combination of VHF-off/LF-on period(s) during the pulse which increases the LF voltage(s) and the DC self-bias as the VHF power is turned off, giving a boost to the ion energies. The tuning of this overlap also controls the ion flux levels.

Thus, an etch rate of a process may be controlled or tuned by changing the phase lag between the source and bias pulse outputs. The phase lag affects or tunes the ion energies and the fluxes at the workpiece surface. For example, for a phase lag of 90°, etch rates are higher as high energy ions will have a large flux. This is because the VHF source pulse is already "on" at the beginning of the bias pulse, which leads to high fluxes, and when the source pulse ends ("off") then the on-phase of bias pulse will leads to high ion energies. A similar analysis applies to other phase lags. For a phase lag of 180° although the ion energies will be higher (as the VHF source is off at the beginning of the bias power pulse), the flux will also be lower (because, again, the source power pulse is off at the beginning of the bias power pulse in this case). As a result, the time-averaged ion fluxes are lower throughout the entire cycle so that the etch rate is expected to be low (it may be lowest at 180° phase lag). A phase lag of 270° is similar in principle to a phase lag of 90°, so that the etch rate behavior will be similar, although the etch rate at 270° will be slightly less than at 90° phase lag. Therefore, the process etch rate is controlled by varying the phase between the VHF source power pulse output of the generators 140 and the bias power pulse output of the generator 144, 148.

Figure 4A:
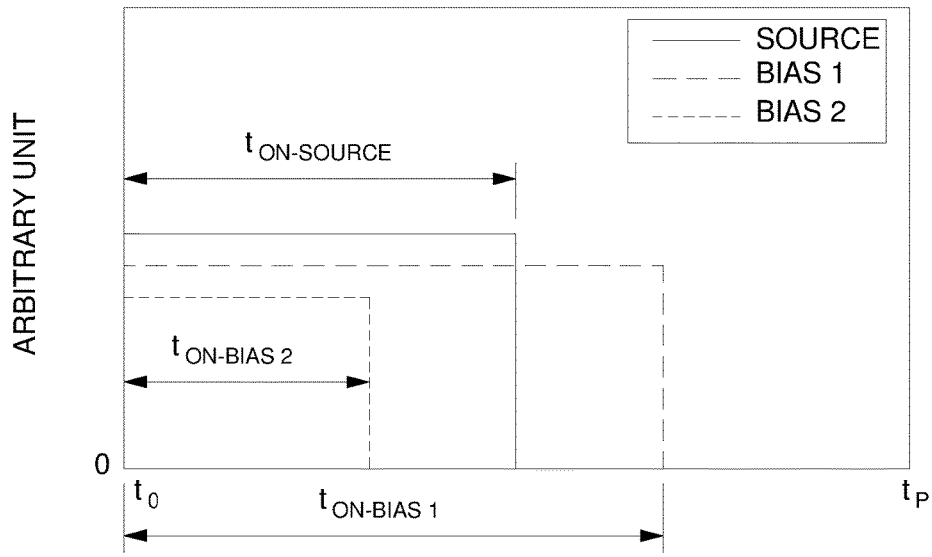
FIG. 4A-B depicts duty cycle and/or phase variation between pulsed waveforms in accordance with some embodiments of the present disclosure.
Figure 4B:
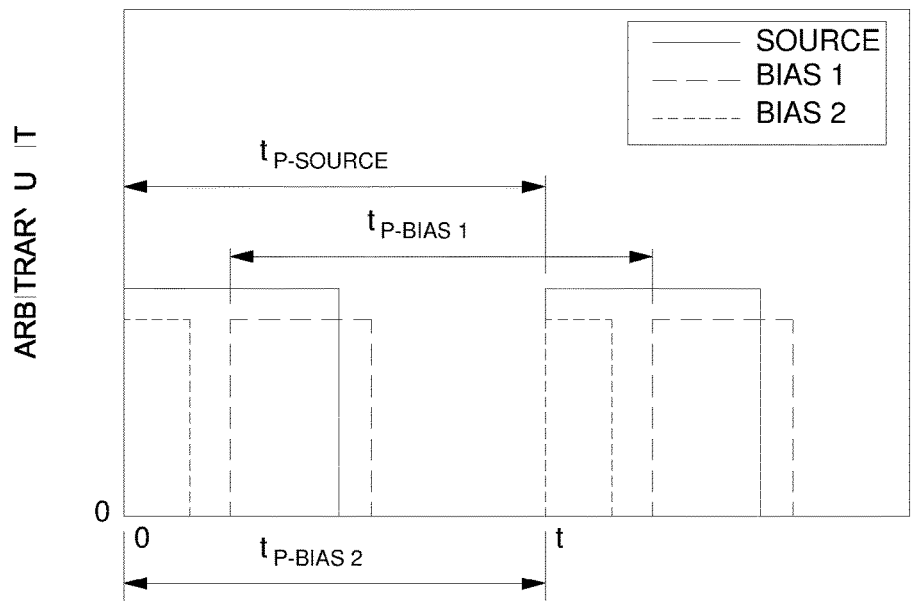

Alternatively, a synchronization of the RF source and bias signals can be achieved by providing each signal in-phase and varying duty cycle. FIG. 4A depicts duty cycle variation between pulsed waveforms in accordance with some embodiments of the present disclosure. For example, the source and bias signals may be in-phase as shown with each signal having a different duty cycle. As depicted in FIG. 4, the "on" periods of each duty cycle begin at time zero of the pulse duration $t_P$ and have varying "off" periods. For example, (not shown) the source and bias signals may be in-phase, with the source signal having a shorter duty cycle that either of the bias signals. Hence, the source signal enters an "off" period while each bias signal is still in an "on" period. The foregoing example may be advantageous for creating higher sheath voltages and ion energies, which may increase the etch rate of the material being etched.

Alternatively or in combination, one or more of the RF source and bias signals can be provided with a phase lead or lag with respect to each other. However, for synchronization to be achieved, the pulse duration of each signal should be the same or an integer multiple thereof. For example, in FIG. 4B, the $t_{P-SOURCE}$, $t_{P-BIAS1}$, and $t_{P-BIAS2}$ are equivalent, and the source, bias1, and bias 2 signals are synchronized. The bias1 signal has both a phase lag and different duty cycle with respect to the source and bias2 signals. The bias 2 signal has a different duty cycle with respect to the source signal. However, because each signal has an equivalent $t_P$, the signals remain synchronized even though at least one of phase or duty cycle differs between them.

Figure 5:
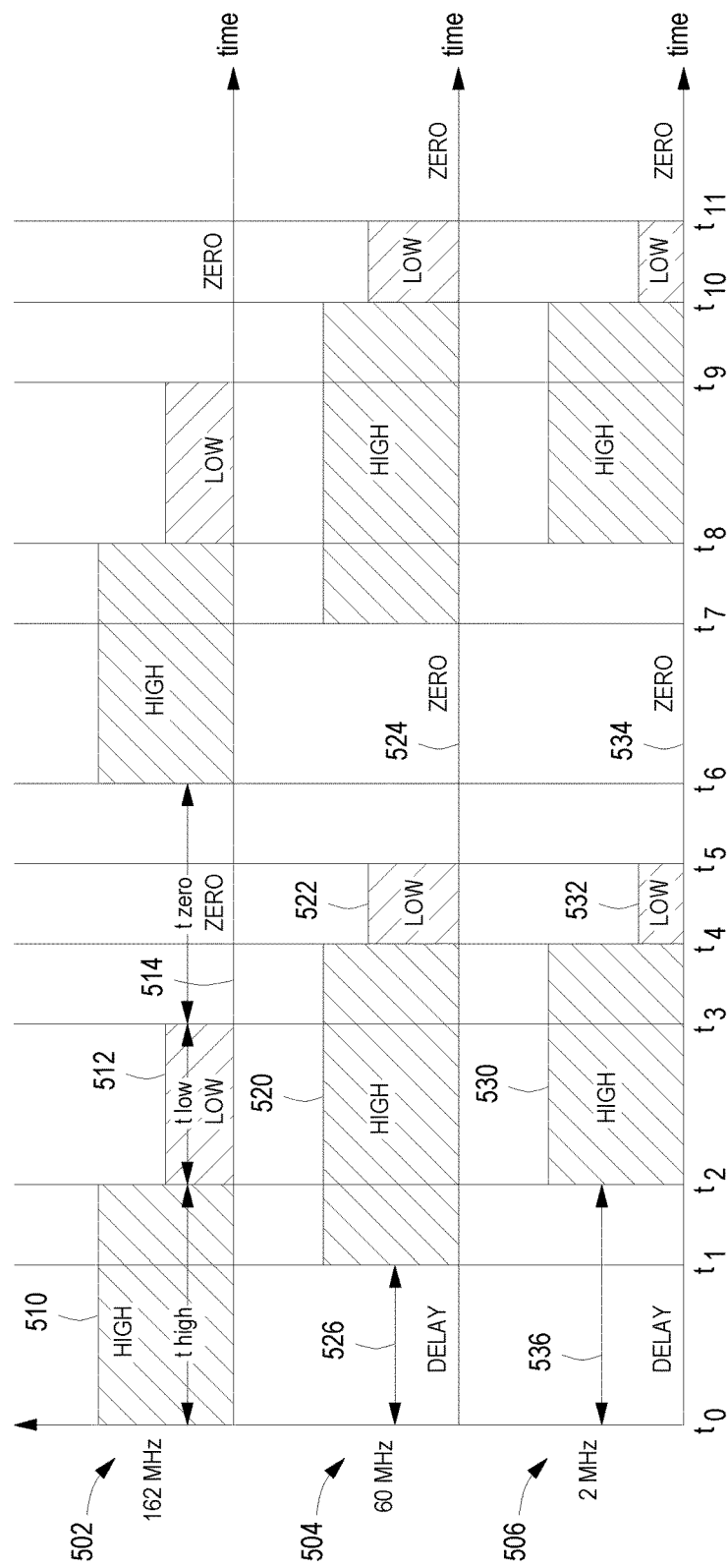
FIG. 5 depicts duty cycle and/or phase variation between multiple synchronized multi-level RF pulsed waveforms in accordance with some embodiments of the present disclosure.

FIG. 5 depicts three separate RF power waveforms 502, 504, and 506 that may be each pulsed at multiple power levels (e.g., dual and/or triple level pulsing) independently and out-of-phase with each other, or with varying duty cycle consistent with embodiments of the present disclosure. The RF power waveforms 502, 504, and 506 may be provided by source and bias generators 140, 144, and 148 respectively. Each RF power waveform advantageously provides consistent levels of RF power to allow the matching networks to adequately tune to the best matching position to reduce the reflected power. The use of multiple level pulsed radio frequency (RF) power also allows for rapid plasma intensity changes and approximation of a saw tooth pattern wave pattern which may be desirable in some processes. The three separate RF waveforms 502, 504, and 506 may be pulsed synchronously or asynchronously with each other.

In FIG. 5, the first RF waveform 502 may be introduced at time $t_0$ and may comprise a first power pulse at a first power level 510, a second power pulse at a second power level 512, and a third power pulse at a third power level 514 that are applied during three corresponding RF power periods $t_{HIGH}$, $t_{LOW}$, and $t_{ZERO}$. As illustrated in the figure, the first RF power pulse 510 may precede the second RF power pulse 512, and the second power pulse 512 may precede the third RF power pulse 514. If desired, additional first to third RF power pulses 510, 512, and 514 may be provided in that order, or in a different order. As shown in FIG. 5, the first RF power pulse 510 may be provided at a high power level, the second RF power pulse 512 may be provided at a low power level that is lower than the first power level of the first RF power pulse 510, and the third power level may be provided at a zero power level. Additional steps (i.e., additional RF power pulses) and power levels may be used as appropriate to further approximate a desired saw tooth wave pattern. In some embodiments, each of the time periods $t_{HIGH}$, $t_{LOW}$, and $t_{ZERO}$ that each RF power pulse 510, 512, and 514 is applied is different from each other. In other embodiments, two or more of the time periods $t_{HIGH}$, $t_{LOW}$, and $t_{ZERO}$ that each RF power pulse 510, 512, and 514 is applied may be equivalent to each other. Although the first RF waveform 502 may be provided at a frequency of 162 MHz as shown in FIG. 5, other frequencies as described above may be used. For example, the first RF waveform 502 may be provided at a frequency in the range of 120 MHz to 162 MHz.

The second RF waveform 504 may be introduced after delay 526. Similar to the first RF waveform 502, the second RF waveform 504 may comprise a first power pulse at a first power level 520, a second power pulse at a second power level 522, and a third power pulse at a third power level 524, that are applied during three corresponding RF power periods. The second RF waveform 504 may be synchronized with the first RF waveform 502. As illustrated in FIG. 5, the first RF power pulse 520 may precede the second RF power pulse 522, and the second power pulse 522 may precede the third RF power pulse 524. If desired, additional first to third RF power pulses 520, 522, and 524 may be provided in that order, or in a different order. As shown in FIG. 5, the first RF power pulse 520 may be provided at a high power level, the second RF power pulse 522 may be provided at a low power level that is lower than the first power level of the first RF power pulse 520, and the third power level may be provided at a zero power level. Additional steps (i.e., additional RF power pulses) and power levels may be used as appropriate to further approximate a desired saw tooth wave pattern. In some embodiments, each of the time periods that each RF power pulse 520, 522, and 524 is applied is different from each other. In other embodiments, two or more of the time periods that each RF power pulse 520, 522, and 524 is applied may be equivalent to each other. Although the second RF waveform 504 may be provided at a frequency of 60 MHz as shown in FIG. 5, other frequencies as described above may be used. For example, the second RF waveform 504 may be provided at a frequency in the range of 400 kHz to 60 MHz.

The third RF waveform 506 may be introduced after delay 536. The third RF waveform 506 may comprise a first power pulse at a first power level 530, a second power pulse at a second power level 532, and a third power pulse at a third power level 534, that are applied during three corresponding RF power periods. In some embodiments, the third RF waveform 506 may only be provided at two power levels (i.e., dual level pulsing). The third RF waveform 506 may be synchronized with the first RF waveform 502 and/or the second RF waveform 504. In some embodiments, all three RF waveforms are synchronized with each other. As illustrated in FIG. 5, the first RF power pulse 530 may precede the second RF power pulse 532, and the second power pulse 532 may precede the third RF power pulse 534. If desired, additional first to third RF power pulses 530, 532, and 534 may be provided in that order, or in a different order. As shown in FIG. 5, the first RF power pulse 530 may be provided at a high power level, the second RF power pulse 532 may be provided at a low power level that is lower than the first power level of the first RF power pulse 530, and the third power level may be provided at a zero power level. Additional steps (i.e., additional RF power pulses) and power levels may be used as appropriate to further approximate a desired saw tooth wave pattern. In some embodiments, each of the time periods that each RF power pulse 530, 532, and 534 is applied is different from each other. In other embodiments, two or more of the time periods that each RF power pulse 530, 532, and 534 is applied may be equivalent to each other. Although the third RF waveform 506 may be provided at a frequency of 2 MHz as shown in FIG. 5, other frequencies as described above may be used. For example, the third RF waveform 506 may be provided at a frequency in the range of 400 kHz to 60 MHz.

Figure 6:
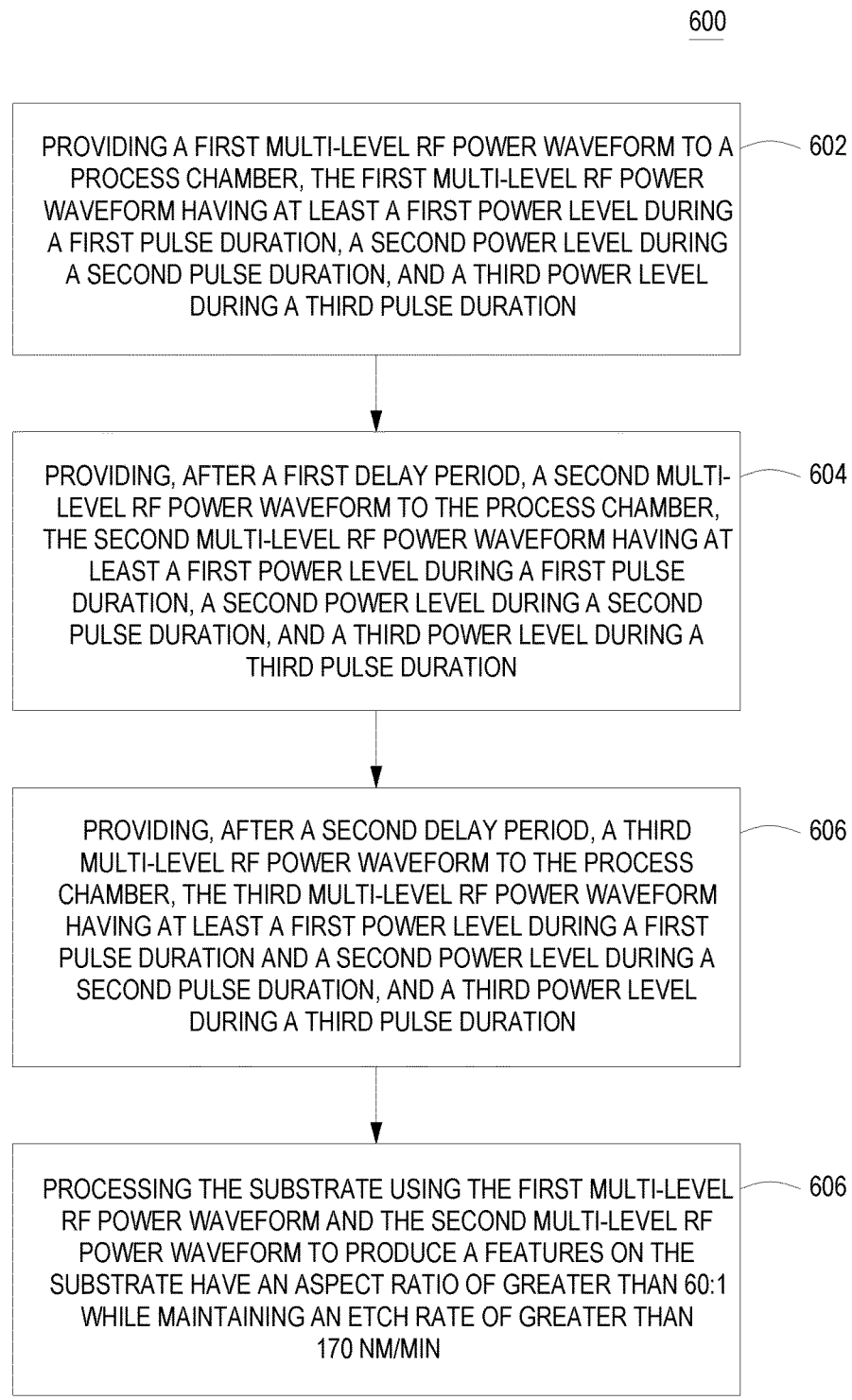
FIG. 6 depicts a flow chart of a method for operating a plasma enhanced substrate processing system using multiple level pulsed radio frequency (RF) power in accordance with some embodiments of the present disclosure.

FIG. 6 depicts a flow chart of a method 600 for operating a plasma enhanced substrate processing system using multiple level pulsed radio frequency (RF) power in accordance with some embodiments of the present disclosure. The method 600 may be performed, for example, in the plasma reactor discussed above in FIG. 1. The method 600 begins at 602 by providing a first multi-level RF power waveform to a process chamber, the first multi-level RF power waveform having at least a first power level during a first pulse duration, a second power level during a second pulse duration, and a third power level during a third pulse duration, such as a signal provided by the generator 140. In some embodiments, the first multi-level RF power waveform is an RF source signal. The first multi-level RF power waveform may be provided at a VHF frequency of between about 60 MHz to about 162 MHz. In some embodiments, the VHF frequency of the first RF source signal is about 162 MHz. In some embodiments, the VHF frequency of the first RF source signal is about 60 MHz. In some embodiments, the first power level of the first pulse duration may be about 200 watts to about 5.0 kW (e.g., 3.6 kW), the value of the second power level may be about 1-99% of the first power level, and the third power level may be zero. In other embodiments, the second power level may be greater than the first power level. In some embodiments, the third power level may not be zero, and may be about 1-99% of the second power level. Still in other embodiments, the third power level may be greater than the first and/or second power levels.

At 604, a second multi-level RF power waveform is provided to the process chamber, the second multi-level RF power waveform having at least a first power level during a first pulse duration, a second power level during a second pulse duration, and a third power level during a third pulse duration, such as a signal provided by the generator 144. In some embodiments, the second multi-level RF power waveform is provided after a first delay period. In some embodiments, the first delay period may between 10 μs-1 ms. In some embodiments, the delay may be greater than 1 ms. In some embodiments, the second multi-level RF power waveform is an RF bias signal. In other embodiments, the second multi-level RF power waveform may be a second RF source signal. The second multi-level RF power waveform may be provided at a frequency of between about 2 MHz to about 162 MHz. In some embodiments, the frequency of the second RF source signal is about 60 MHz. In some embodiments, the first power level of the first pulse duration of the second RF source signal may be about 200 watts to about 5.0 kW (e.g., 3.6 kW), the value of the second power level may be about 1-99% of the first power level, and the third power level may be zero. In other embodiments, the second power level may be greater than the first power level. In some embodiments, the third power level may not be zero, and may be about 1-99% of the second power level. Still in other embodiments, the third power level may be greater than the first and/or second power levels. In some embodiments, the second multi-level RF waveform may be synchronized with the first multi-level RF waveform.

At 606, a third multi-level RF power waveform is provided to the process chamber, the third multi-level RF power waveform having at least a first power level during a first pulse duration, a second power level during a second pulse duration, and a third power level during a third pulse duration, such as a signal provided by the generator 148. In some embodiments, the third multi-level RF power waveform is provided after a second delay period. In some embodiments, the second delay period may between 10 μs-1 ms. In some embodiments, the second delay may be greater than 1 ms. In some embodiments, the third multi-level RF power waveform is another RF bias signal. In other embodiments, the third multi-level RF power waveform may be another RF source signal. The third multi-level RF power waveform may be provided at a frequency of between about 2 MHz to about 162 MHz. In some embodiments, the frequency of the third multi-level RF power waveform is about 2 MHz. In some embodiments, the first power level of the first pulse duration of the third multi-level RF power waveform may be about 200 watts to about 5.0 kW (e.g., 3.6 kW), the value of the second power level may be about 1-99% of the first power level, and the third power level may be zero. In other embodiments, the second power level may be greater than the first power level. In some embodiments, the third power level may not be zero, and may be about 1-99% of the second power level. Still in other embodiments, the third power level may be greater than the first and/or second power levels. The third multi-level RF power waveform may be synchronized with the first multi-level RF waveform and/or the second multi-level RF waveform. In some embodiments, all three multi-level RF waveforms are synchronized with each other.

At 608, the substrate is processed using the first multi-level RF power waveform and the second multi-level RF power waveform to produces features on the substrate having an aspect ratio (A/R) of greater than 60:1 while maintaining an etch rate of greater than 170 nm/min. In some embodiments, the A/R is greater than 60:1 and the etch rate is maintained at least at a level of 240 nm/min. In some embodiments, the A/R is greater than 70:1. In some embodiment, the etch rate is maintained at a level of 250-350 nm/min. In some embodiments, the substrate processing described herein produces an improved mask selectivity of greater than 5:1 on the substrate. In some embodiments, the substrate processing described herein produces reduced profile bowing effects having a delta CD less than 20 nm.

In some embodiments, a pulsed DC signal may be supplied, for example, from the DC pulse generator 162 to maintain a constant chucking force on the substrate 137 during plasma processing. For example, the chucking force can vary with the charge on the substrate 137 and cause damage or cracking of the substrate if not properly maintained. Further, variation in the chucking force may lead to variation in heat transfer from the substrate to the substrate support, undesirably leading to process variation and/or rejected substrates. The pulsed DC signal can be synchronized with one or more of the first, second, or third RF signals, for example, to provide a constant chucking force during plasma processing. In some embodiments, the pulsed DC signal is synchronized to be in phase with the first RF signal (e.g., source signal). For example, when the source signal is "on", the DC signal is "on." When the source signal is "off", the DC signal may be "off." Alternatively, the DC signal may be provided at "high" and "low" levels that respectively correspond with the on and off periods of the RF signal.

Figure 7:
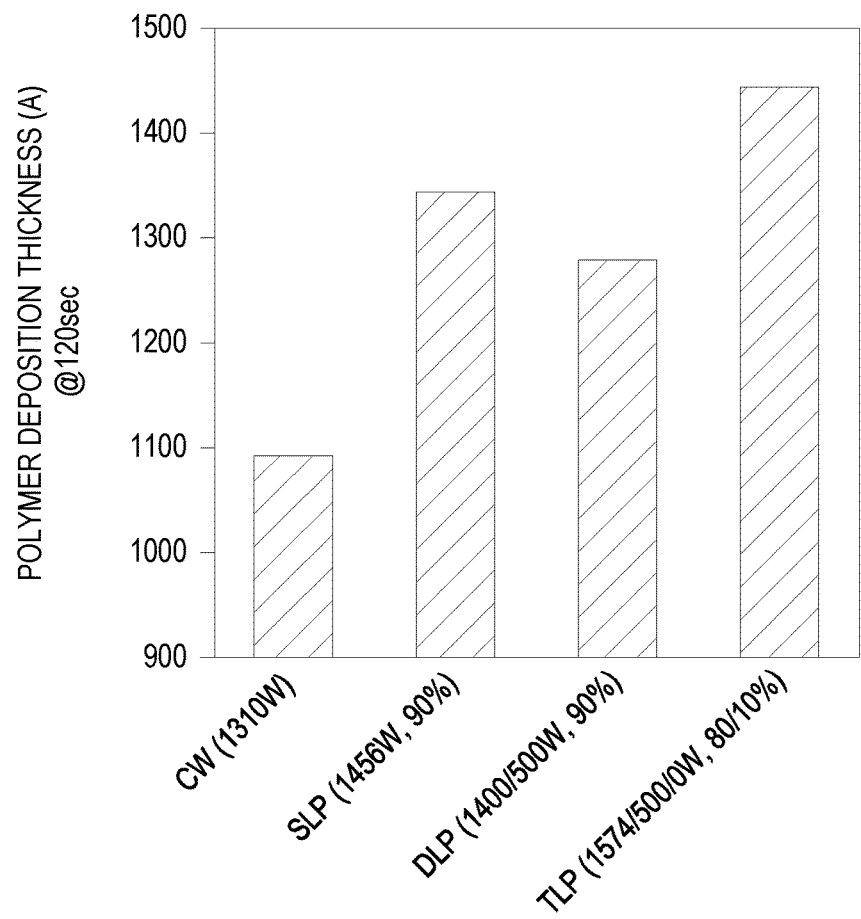
FIG. 7 depicts differences in polymer deposition thickness (A) at 120 seconds.

FIG. 7 depicts differences in polymer deposition thickness (A) at 120 seconds of processing for a continuous wave (CW) processing, single-level processing (SLP), dual level processing (DLP), and triple-level processing (TLP). As can be shown, the polymer deposition thickness (A) at 120 second for TLP reaches over 1400 A at 120 seconds.

Figure 8A:
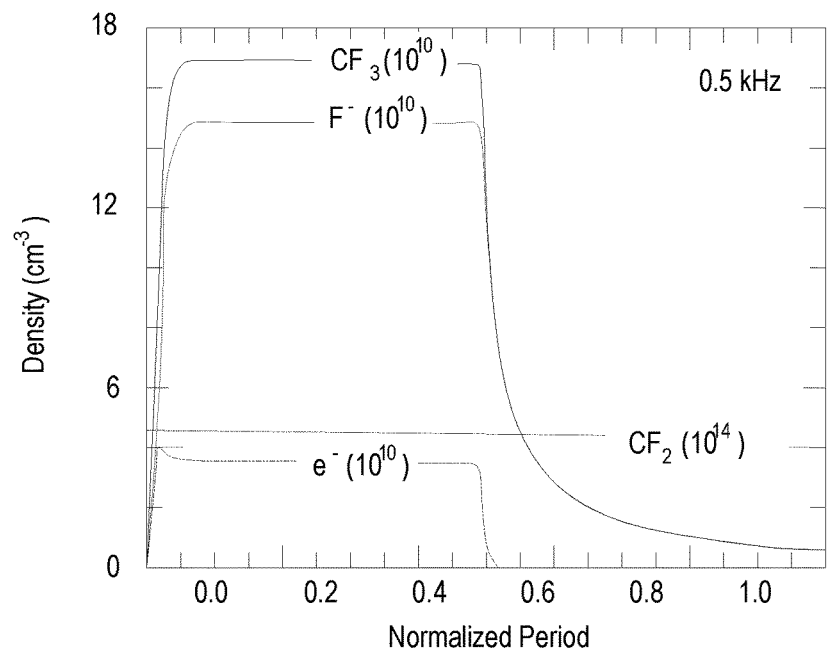
FIGS. 8A and 8B depict dissociation levels of fluorocarbon gas molecules using the inventive multi-level pulsing described herein.
Figure 8B:
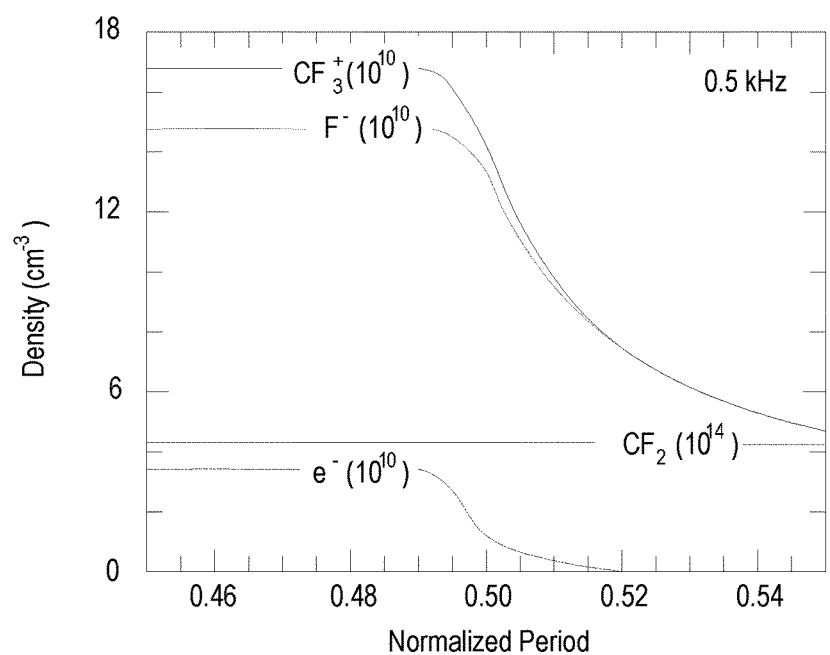

FIGS. 8A and 8B depict dissociation levels of fluorocarbon gas molecules using the inventive multi-level pulsing described herein. Specifically, multi-level pulsed RF avoids excessive dissociation of fluorocarbon gas molecules (i.e., suppress free fluorine and carbon radials). Avoiding excessive dissociation leads to more deposition (i.e., higher mask selectivity) but less clogging. In FIGS. 8A and 8B, electron are shown to survive 60 msec from power ramp down, and ions are shown to survive through the pulse period, but the density becomes <6% from power ramp down. In addition, CF2 molecules are shown to survive through the pulse period without density reduction.

Figure 9:
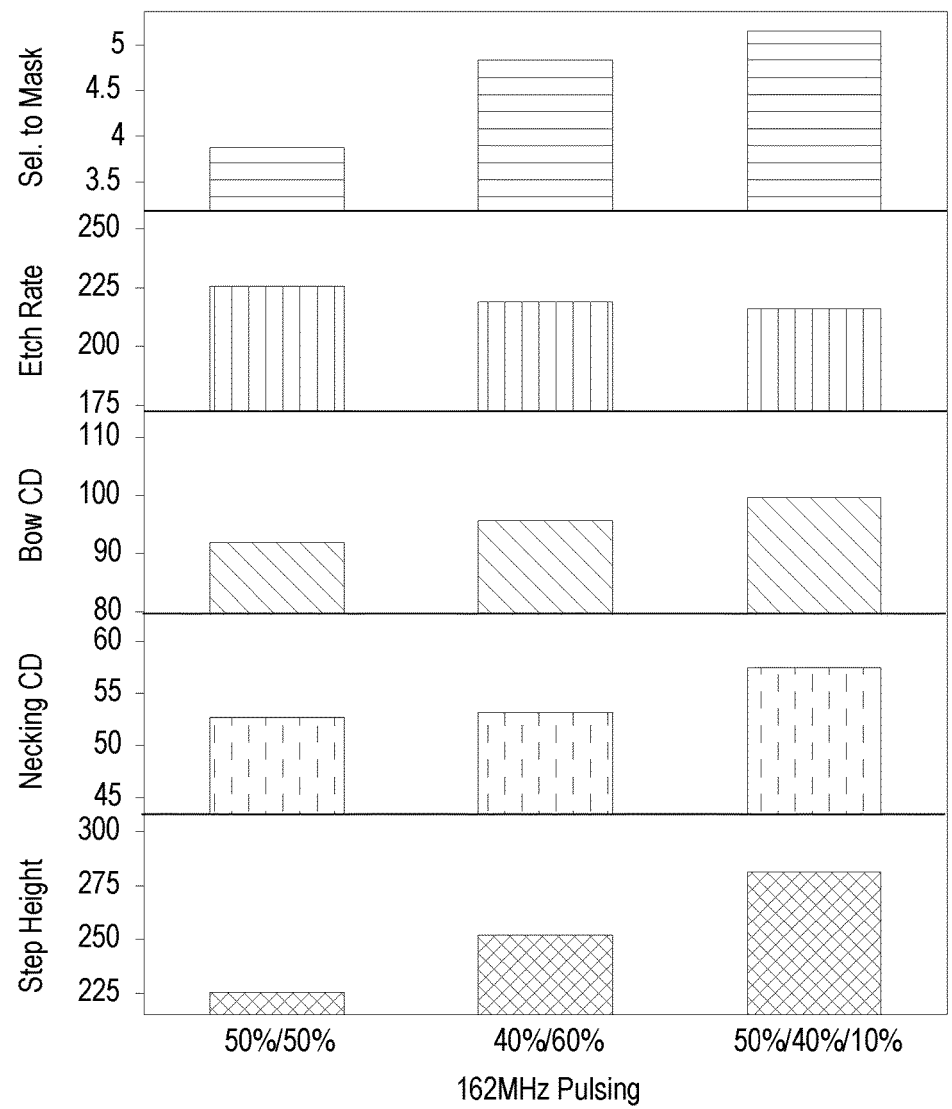
FIG. 9 depicts various substrate properties using the inventive multi-level RF pulsing described herein using the inventive multi-level pulsing described herein.

FIG. 9 depicts various substrate properties at 50%/50% DLP, 40%/60% DLP, and 50%/40%/10% TLP RIE processing using the inventive multi-level RF pulsing described herein. Properties include step height, necking CD, Bowing CD, etch rate and mask selectivity. Mask Necking versus VHF Source Pulse Design.

Thus, methods for operating a plasma enhanced substrate processing system using multiple level pulsed RF power are provided herein. The inventive methods may advantageously provide improved mask selectivity (e.g., >5:1), and maintains a wider process window which protects against etch stop issues that arise due to the mask entrance being clogged. Furthermore, embodiments consistent with the present disclosure reduce profile bowing effects (e.g., delta CD <20 nm) and an aspect ratio (A/R) of greater than 60:1 while maintaining an etch rate of greater than 170 nm/min. In some embodiments, the A/R is greater than 60:1 and the etch rate is maintained at least at a level of 240 nm/min. In some embodiments, the A/R is greater than 70:1 and the etch rate is maintained at a level of 250-350 nm/min.

While the foregoing is directed to embodiments of the present disclosure, other and further embodiments of the disclosure may be devised without departing from the basic scope thereof.

The invention claimed is:

1. A method for processing a substrate in a plasma enhanced substrate processing system using multi-level pulsed RF power, comprising:
providing, from a first RF generator, a first multi-level RF power waveform to a process chamber, the first multi-level RF power waveform having at least a first power level during a first pulse duration, a second power level during a second pulse duration, and a third power level during a third pulse duration, wherein the first, second and third power levels of the first multi-level RF power waveform are different from each other;
providing, from a second RF generator and_after a first delay period, a second multi-level RF power waveform to the process chamber, the second multi-level RF power waveform having at least a first power level during a first pulse duration, a second power level during a second pulse duration, and a third power level during a third pulse duration, wherein the first, second and third power levels of the second multi-level RF power waveform are different from each other; and processing the substrate using the first multi-level RF power waveform and the second multi-level RF power waveform to produce features on the substrate having an aspect ratio of greater than 60:1 while maintaining an etch rate of greater than 170 nm/min.

2. The method of claim 1, wherein the features produced on the substrate have an aspect ratio of greater than 60:1 while maintaining an etch rate of at least 240 nm/min.

3. The method of claim 1, wherein the first power level of the first multi-level RF power waveform is a high power level, the second power level of the first multi-level RF power waveform is a low power level that is lower than the first power level of the first multi-level RF power waveform, and the third power level of the first multi-level RF power waveform is a zero power level.

4. The method of claim 3, wherein the first power level of the second multi-level RF power waveform is a high power level, the second power level of the second multi-level RF power waveform is a low power level that is lower than the first power level of the second multi-level RF power waveform, and the third power level of the second multi-level RF power waveform is a zero power level.

5. The method of claim 1, further comprising:
providing, from a third RF generator and after a second delay period, a third multi-level RF power waveform to the process chamber, the third multi-level RF power waveform having at least a first power level during a first pulse duration and a second power level during a second pulse duration, wherein the first, second and third power levels of the third multi-level RF power waveform are different from each other.

6. The method of claim 5, wherein the first multi-level RF power waveform and the third multi-level RF power waveform are synchronized.

7. The method of claim 5, wherein the first multi-level RF power waveform, the second multi-level RF power waveform are synchronized, and the third multi-level RF power waveform are synchronized.

8. The method of claim 5, wherein one of the first, second and third power levels of each of the first, second, and third multi-level RF power waveforms is a zero power level.

9. The method of claim 5, wherein a duration of time that each of the first, second and third power levels of the first multi-level RF power waveform are applied are different from each other.

10. The method of claim 5, wherein a duration of time that each of the first, second and third power levels of the second multi-level RF power waveform are applied are different from each other.

11. The method of claim 5, wherein a duration of time that each of the first, second and third power levels of the third multi-level RF power waveform are applied are different from each other.

12. The method of claim 5, wherein first multi-level RF power waveform is a source RF signal, and the second and third multi-level RF power waveforms are RF bias signals.

13. The method of claim 1, wherein the substrate is processed using a Reactive Ion Etch (RIE) process.

14. The method of claim 1, wherein processing the substrate using the multi-level pulsed RF power produces a mask selectivity of greater than 5:1.

15. The method of claim 1, wherein processing the substrate using the multi-level pulsed RF power produces reduced profile bowing effects having a delta CD less than 20 nm.

16. A non-transitory computer readable medium having instructions stored thereon that, when executed, cause a method of operating a plasma enhanced substrate processing system using multi-level pulsed RF power to be performed, the method comprising:
providing, from a first RF generator, a first multi-level RF power waveform to a process chamber, the first multi-level RF power waveform having at least a first power level during a first pulse duration, a second power level during a second pulse duration, and a third power level during a third pulse duration, wherein the first, second and third power levels of the first multi-level RF power waveform are different from each other;
providing, from a second RF generator and after a first delay period, a second multi-level RF power waveform to the process chamber, the second multi-level RF power waveform having at least a first power level during a first pulse duration, a second power level during a second pulse duration, and a third power level during a third pulse duration, wherein the first, second and third power levels of the second multi-level RF power waveform are different from each other; and
processing the substrate using the first multi-level RF power waveform and the second multi-level RF power waveform to produce feature on the substrate having an aspect ratio of greater than 60:1 while maintaining an etch rate of greater than 170 nm/min.

17. A method for processing a substrate in a plasma enhanced substrate processing system using multi-level pulsed RF power, comprising:
providing, from a first RF generator, a first multi-level RF power waveform to a process chamber, the first multi-level RF power waveform having at least a first power level during a first pulse duration, a second power level during a second pulse duration, and a third power level during a third pulse duration, wherein the first, second and third power levels of the first multi-level RF power waveform are different from each other;
providing, from a second RF generator and after a first delay period, a second multi-level RF power waveform to the process chamber, the second multi-level RF power waveform having at least a first power level during a first pulse duration, a second power level during a second pulse duration, and a third power level during a third pulse duration, wherein the first, second and third power levels of the second multi-level RF power waveform are different from each other;
providing, from a third RF generator and after a second delay period, a third multi-level RF power waveform to the process chamber, the third multi-level RF power waveform having at least a first power level during a first pulse duration and a second power level during a second pulse duration, wherein the first, second and third power levels of the third multi-level RF power waveform are different from each other; and
processing the substrate using the first multi-level RF power waveform and the second multi-level RF power waveform to produce features on the substrate having an aspect ratio of greater than 60:1 while maintaining an etch rate of greater than 170 nm/min, wherein processing the substrate using the multi-level pulsed RF power produces a mask selectivity of greater than 5:1 and reduced profile bowing effects having a delta CD less than 20 nm.

18. The method of claim 17, wherein the substrate is processed using a Reactive Ion Etch (RIE) process.

19. The method of claim 17, wherein the features produced on the substrate have an aspect ratio of greater than 60:1 while maintaining an etch rate of at least 240 nm/min.

20. The method of claim 19, wherein a duration of time that each of the first, second and third power levels of the third multi-level RF power waveform are applied are different from each other.

\* \* \* \* \*